United States Patent [19]
Kao

[11] Patent Number: 5,802,250
[45] Date of Patent: Sep. 1, 1998

[54] METHOD TO ELIMINATE NOISE IN REPEATED SOUND START DURING DIGITAL SOUND RECORDING

[75] Inventor: Oliver C. K. Kao, Hsin-Chu, Taiwan

[73] Assignee: United Microelectronics Corporation, Hsinchu, Taiwan

[21] Appl. No.: 340,001

[22] Filed: Nov. 15, 1994

[51] Int. Cl.⁶ .............. G10L 3/02; G10L 9/00; G10L 5/02
[52] U.S. Cl. .............. 395/2.37; 395/2.35; 395/2.74
[58] Field of Search .............. 395/2.74, 2.76, 395/2.42, 2.67, 2.39, 2.37, 2.35; 381/34, 40, 35, 52, 51

[56] References Cited

U.S. PATENT DOCUMENTS

| | | | |
|---|---|---|---|
| 3,575,555 | 4/1971 | Schame | 179/1 |
| 3,892,919 | 7/1975 | Ichikawa | 395/2.74 |
| 4,374,302 | 2/1983 | Vogten et al. | 395/2.74 |
| 4,423,290 | 12/1983 | Yoshida et al. | 381/51 |
| 4,577,343 | 3/1986 | Oura | 381/51 |
| 4,658,369 | 4/1987 | Suguira | 364/513.5 |
| 4,691,359 | 9/1987 | Morito | 395/2.74 |
| 4,692,941 | 9/1987 | Jacks et al. | 381/52 |
| 4,843,488 | 6/1989 | Watatani et al. | 360/19.1 |
| 4,937,873 | 6/1990 | McAulay et al. | 381/51 |
| 4,989,246 | 1/1991 | Wan et al. | 381/40 |
| 5,247,130 | 9/1993 | Suzuki et al. | 84/622 |

OTHER PUBLICATIONS

J. Taboada et al., Explicit Estimation of Speech Boundaries', IEE Pro.-Sci.Meas.Technol., vol. 141.No.3,May 1994, pp. 153–159.

L.R.Rabiner / R.W.Schafer,"Digital Processing of Speech Signals", Prentice–Hall 1978, pp. 179–218.

J.N.Holmes, "Speech Synthesis and Recognition", Chapman &Hall 1988, pp.54–59.

Primary Examiner—Allen R. MacDonald
Assistant Examiner—Patrick N. Edouard
Attorney, Agent, or Firm—Barnes, Kisselle, Raisch, Choate, Whittemore & Hulbert P.C.

[57] ABSTRACT

A method to eliminate noise in repeated sound start during a digital sound recording playback by using a slowly descending or ascending waveform to eliminate the discontinuity between sound waves which can be utilized in applications such as a playback only sound synthesis or a recording and playback system.

8 Claims, 5 Drawing Sheets

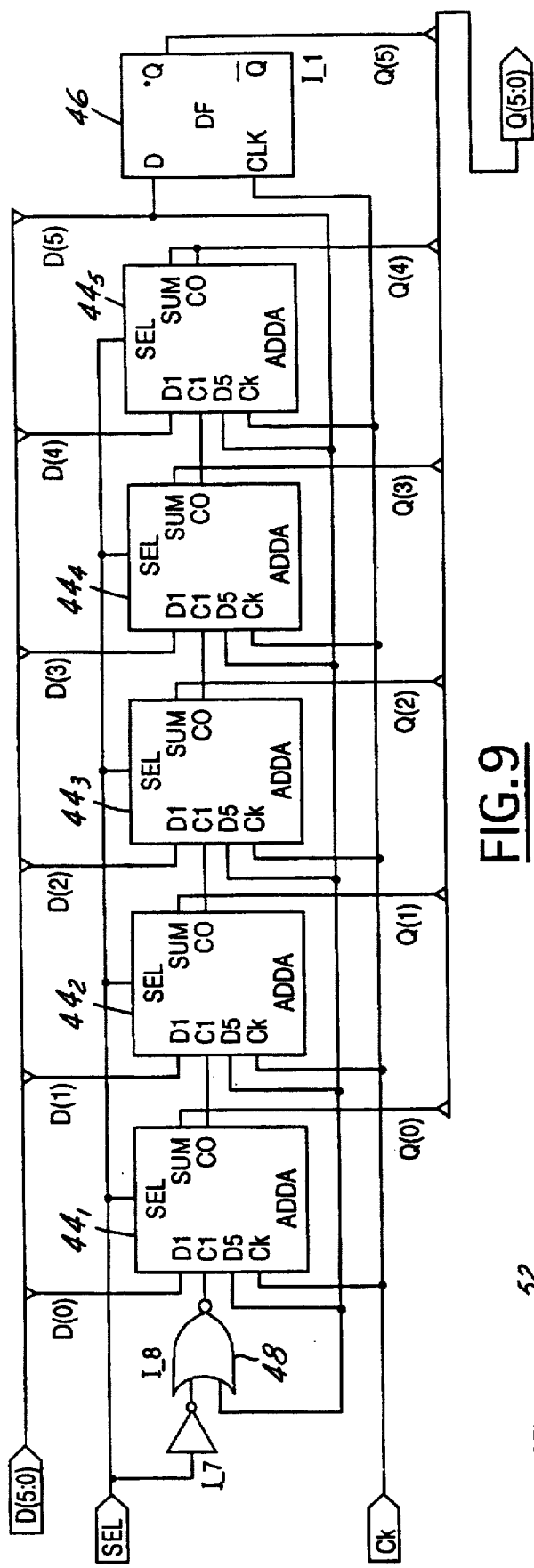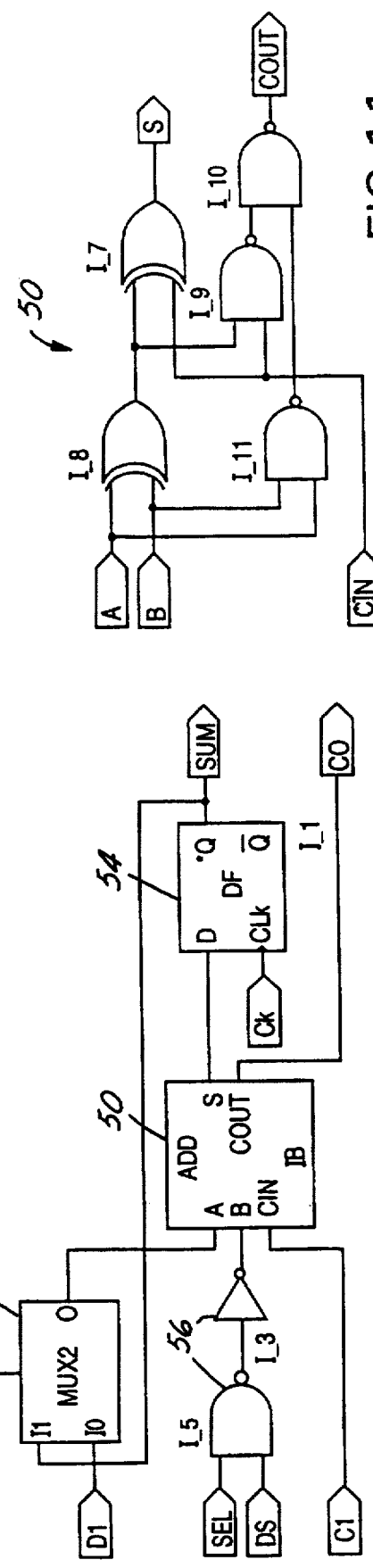
FIG. 9
FIG. 10
FIG. 11

METHOD TO ELIMINATE NOISE IN REPEATED SOUND START DURING DIGITAL SOUND RECORDING

FIELD OF THE INVENTION

The present invention generally relates to a method of eliminating noise in repeated sound start during digital sound recording, and, more particularly, relates to a method of eliminating noise in repeated sound start during a digital sound recording process by using a slowly descending or ascending waveform technique.

BACKGROUND OF THE INVENTION

In the recording of a human voice, the words or sentences of a human voice can be transformed from analog signals into corresponding digital signals by a digital coding system. The digital coding can then be processed by a speech synthesis architecture into a human voice. When a human voice is played back by a speech synthesis architecture system, and if the system receives a trigger signal to stop the playback and to start another playback, unpleasant noise is frequently produced at the point of such change. The noise is generated by a discontinuous waveform occurred when sound is abruptly stopped and the waveform is forced to return to its original starting point at zero voltage.

In recent years, digital voice recording method has gradually replaced the conventional analog recording method which is typically bulky and difficult to operate. The digital voice recording apparatus has the benefits of small size, low energy consumption and a large variety of different applications. It has gained wide popularity in consumer electronic goods such as talking greeting cards, telephone answering machines, and a variety of talking toys. In a digital sound recording system, a coding circuit first converts a human voice to a corresponding sound code and then stores the sound code into a memory device. When a playback of the human voice is desired, the sound code is sequentially taken out of the memory device and sent through a sound synthesizing circuit in order to convert the code into a sound output.

The sound code stored in the memory device can be fixed. This can be achieved by using a ROM (Read Only Memory) to fix the code in an IC chip during a manufacturing process of the IC. During a playback, it is possible to synthesize a word, a sentence or a paragraph in the presently used language. FIG. 1 shows a block diagram for this type of circuit. During a playback of the speaking sound by the system, an address generator 10, which is controlled by a control unit 12, produces a speaking sound code storage address. A ROM 14 is used to store the speaking sound code. Based on the demand of different circuits, the speaking sound code can be sent through a numerical signal processor 16 first and then sent through a digital/analog converter 18, or it can be directly sent from the ROM 14 to the digital/analog converter 18, and then output the speaking sound from a speaker 20.

In a sound system where both the recording and the playback are possible, the memory device used can be either a one-time-PROM for recording once only, a SRAM, a DRAM or an $E^2PROM$ which can be used for unlimited times of recording and playback. A block diagram for this type of device is shown in FIG. 2. A major difference between this circuit and the circuit shown in FIG. 1 is that this circuit allows a direct sound input. This requires an expansion of an analog/digital converter circuit 22. A coding unit 24 is also necessary to change the speaking sound into codes and then store them into a memory device. When a playback of the speaking sound is desired, the speaking sound code is read from the memory device 26. The other components of this circuit, i.e. the address generator 10, the control unit 12, the digital signal processing unit 16, the digital/analog converter 18 and the speaker 20 are the same as that shown in FIG. 1.

A common problem in the above-described two sound systems occurs when during the playback of a speaking sound, a new sound is played before the previous word, sentence or paragraph has finished playing. This forces the sound waveform to abruptly return to the zero voltage point and thus generates a discontinuity in the waveform and produces an unpleasing and undesirable noise.

A typical waveform for such a noise is shown in FIG. 3. A first waveform A represents a first word. Before the playback of the first word A has been finished, the playback is abruptly interrupted at A' by the start of a second word B. The playback of the second word B is again abruptly interrupted at B' by the start of a third word C. The start of a new word before the previous word has finished its playback therefore creates a discontinuity in the waveform. This discontinuity is shown as point A' and point B'. As shown in FIG. 3, the first discontinuity A' occurs at a position of a positive voltage while the second discontinuity B' occurs at a negative voltage.

It is therefore an object of the present invention to provide a method of eliminating noise in repeated sound start during a digital sound recording playback.

It is another object of the present invention to provide a method of eliminating noise in repeated sound starts during a digital sound recording to improve sound quality during playback.

It is a further object of the present invention to provide a method of eliminating noise in repeated sound starts during a digital sound recording playback by using a numerical control method.

It is yet another object of the present invention to provide a method of eliminating noise in repeated sound starts during a digital sound recording playback by using a slowly descending or slowly ascending waveform to eliminate the discontinuity between sound waves.

SUMMARY OF THE INVENTION

In accordance with the present invention, a method to eliminate noise in repeated sound starts during a digital sound recording playback for improving the playback sound quality is provided.

In the preferred embodiment, a sound signal, a 6-bit signal for an example, is first sent through a speech synthesis architecture system to convert the speech code stored in the memory unit into a sound output. When plotted on a digital axis, at the time the system receives a signal to trigger another sound signal, the speech code is first descended or ascended slowly to the position of 100000. This type of slow descending or ascending from any signal other than 100000, i.e., from the peak of 111111 or from the lowest point of 000000 or any other point, to the silent signal mark of 100000 at a very slow rate does not produce unwanted noise. The next sound would start from the position of 100000 and therefore avoid the generation of a noise signal completely.

The process is executed by first examining the position of the sound bit to verify whether it is at the position of 100000. When the sound bit is found not at such a position, a slowly descending or ascending code is added to the sound signal to slowly descend or ascend the sound signal to the position of 100000. When the next sound signal is triggered at such a position, no noise is produced in the sound playback.

BRIEF DESCRIPTION OF THE DRAWINGS

Other objects, features and advantages of the present invention will become apparent upon consideration of the specification and the appended drawings in which:

FIG. 9 is a circuit diagram for another digital signal processing unit shown in FIG. 5.

FIG. 10 is a logic diagram for the ADD circuit shown in FIG. 9.

FIG. 11 is a logic diagram for the ADD shown in FIG. 10.

DETAILED DESCRIPTION OF THE PREFERRED EMBODIMENT

The present invention provides a method of eliminating noise in repeated sound starts during digital sound recording by using a slowly descending or ascending waveform technique to avoid the generation of discontinuities in a waveform curve.

Figure 3:
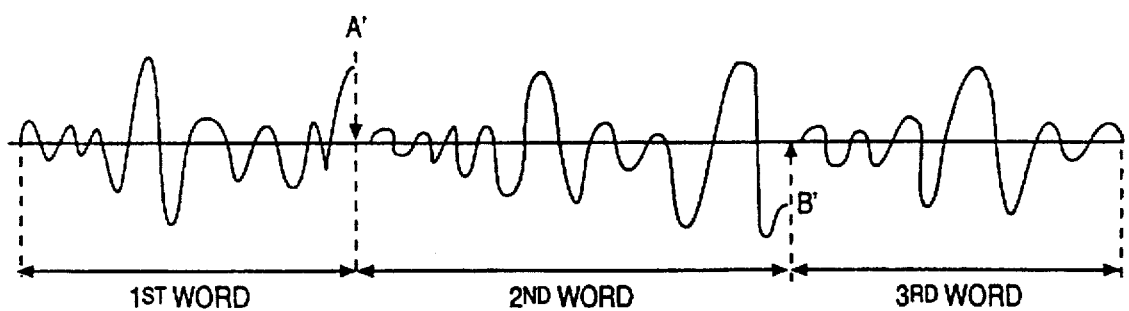
FIG. 3 is a graph showing the waveform for the prior art digital sound playback.
Figure 4:
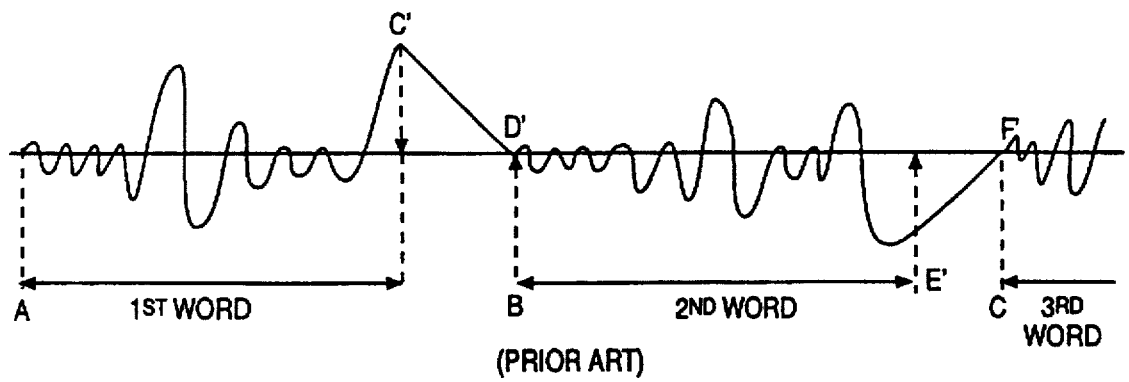
FIG. 4 is a graph showing a waveform for a digital sound playback of the present invention.

Referring initially to FIG. 4, a waveform generated by the present invention digital sound recording method in a playback process is shown. The discontinuity shown in FIG. 3 at A' and B' are completely eliminated. Instead, between the first word A and the second word B, a slowly descending curve C' D' is used to bring the waveform at the voltage C' down to the mid-point voltage point D' slowly. This process avoids the abrupt drop at A' shown in FIG. 3 which causes unpleasant noise. Between the second word B and the third word C, a slowly ascending curve E' F' is used to bring the waveform at E' slowly up to the mid-point voltage point of F'. The abrupt change B' shown in FIG. 3 which generates unpleasant noise is therefore avoided. The waveform shown in FIG. 4 produces a pleasing and harmonious sound without any noise interruptions between the words of A, B and C.

Figure 1:
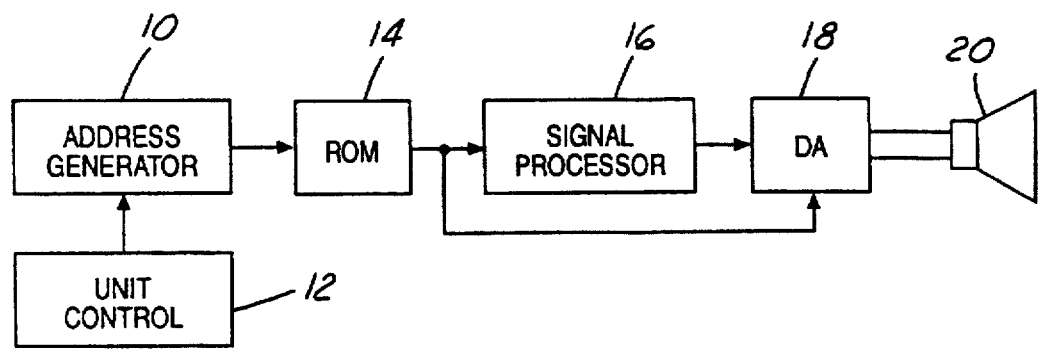
FIG. 1 is a block diagram of a prior art digital sound synthesis system for playback only.
Figure 2:
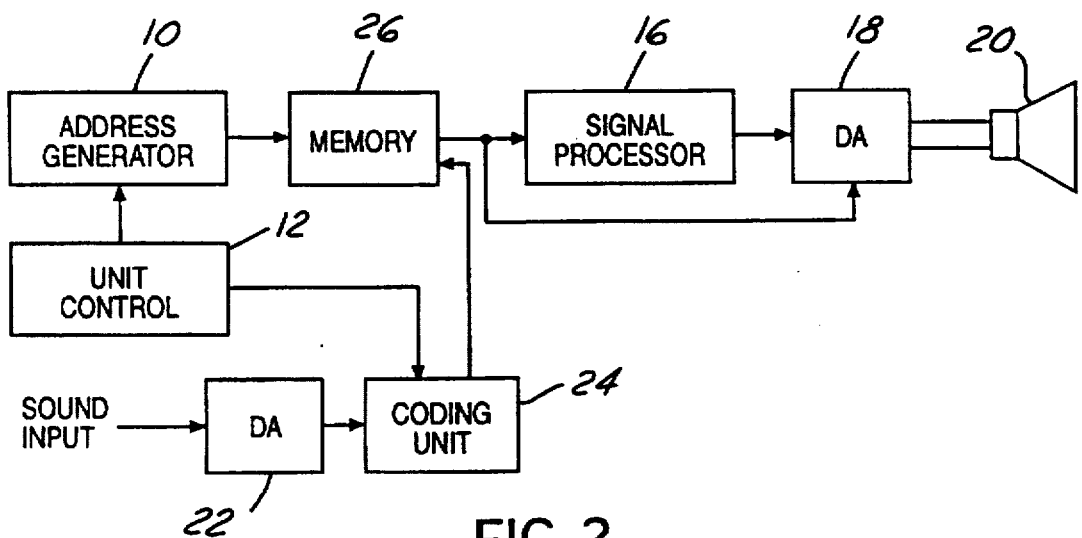
FIG. 2 is a block diagram for another prior art sound recording system.
Figure 5:
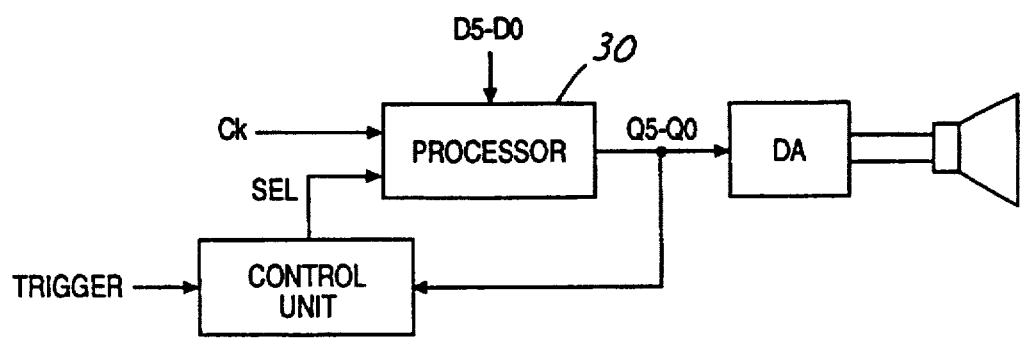
FIG. 5 is a block diagram of the present invention digital sound system output blocks.

In an example of a 6-bit speech waveform, the output of the digital signal processing unit 16 in FIGS. 1 and 2 is not directly fed into a digital/analog conversion unit, but instead is sent through a signal processor 30 as that shown in FIG. 5 where D5–D0 are the input while Q5–Q0 are the output. The highest point of the waveform is 111111, while the lowest point of the waveform is 000000, with the mid-point at 100000. During a speech playback when a SEL signal from a control unit 32 is 0, D5–D0 equal directly to Q5–Q0. If before the speech has been finished playing, i.e., the 6-bit digital signal has not returned to the mid-point, the next trigger starts, then the signal processor 30 shown in FIG. 5 produces output Q5–Q0 as a slow descending or a slow ascending curve such as that shown in FIG. 4 as C' D' or E' F' before the start of the next sound playback.

Figure 6:
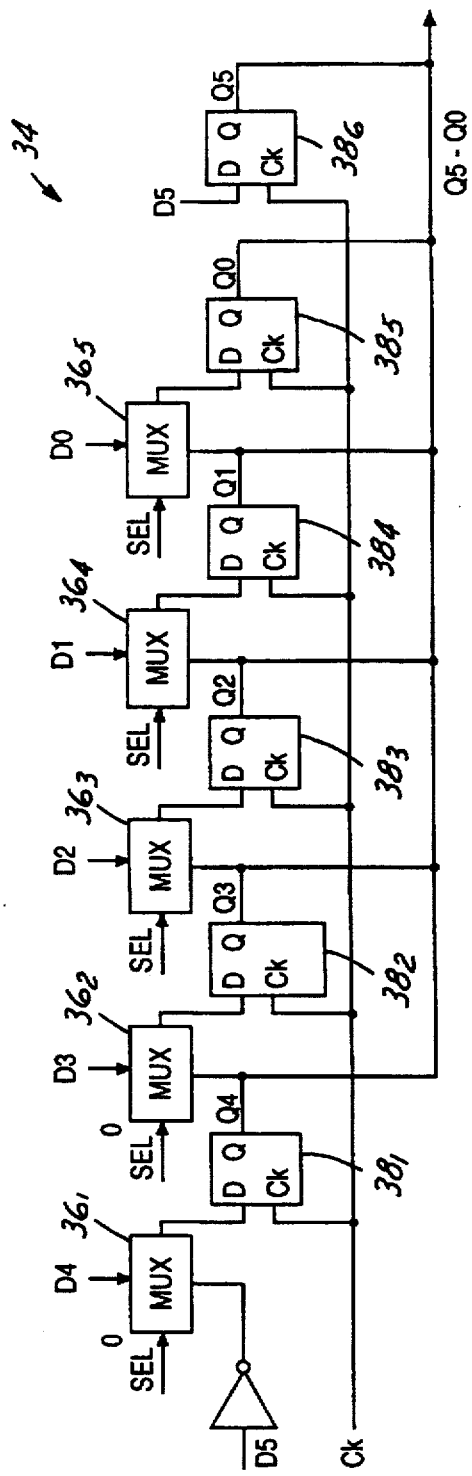
FIG. 6 is a circuit diagram for the digital signal processing unit shown in FIG. 5.
Figure 12:
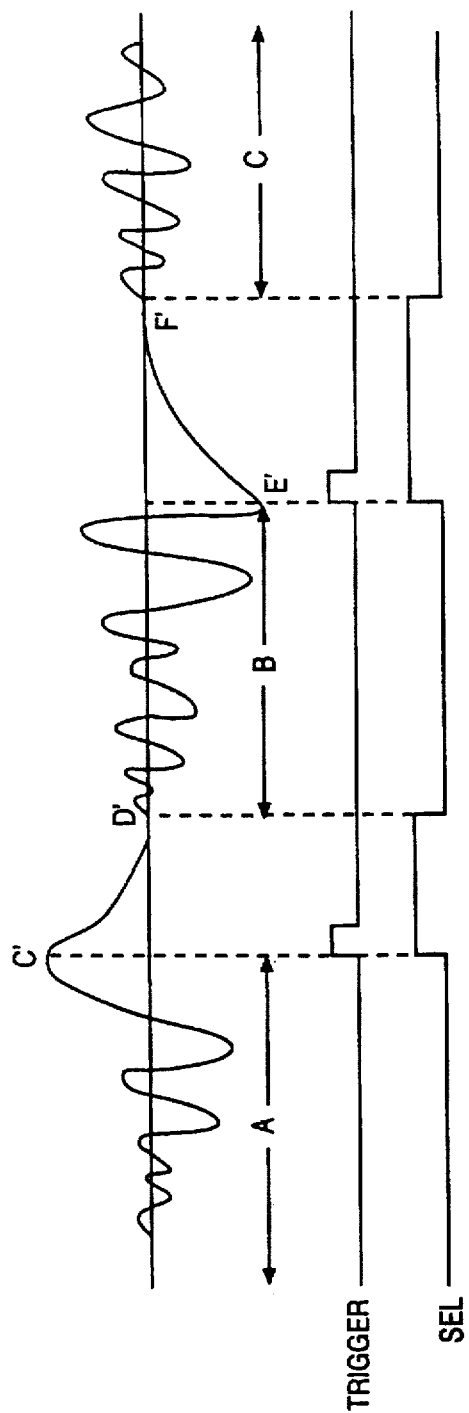
FIG. 12 is a graph showing the waveform and timing sequence for the present invention in a preferred embodiment.

An example of a circuit to illustrate the operation of processor 30 in FIG. 5 is shown in FIG. 6. The result is shown in FIG. 12 in a graph of waveform and timing sequence. It includes a 5-bit shift register 34 consisting of five selector switches (multiplexers) $36_{1-5}$ and six D-type flip-flops $38_{1-6}$. The purpose of the circuit is to provide a gradually ascending or descending digital sequence graphically displayed in FIG. 4 as C' D' or E'F'. It is designed to go in the descending direction to the final 100000 bit position, when there are positive voltages and the mid-point is 100000. Sound signals that are in the negative voltage area (characterized by the mid-point 011111) at the moment of stopping by next trigger signal are in the ascending direction. The SEL signal is set to 0 whenever final 100000 or 011111 position has been reached. The most significant bit (MSB) of the register is processed by means of directly putting D5 into a register's flip-flop stage, with other bits being put in multiplexers MUX. During the process of smoothing discontinuity, SEL signal produced by control unit 32 is in "1" state. Since all flip-flop stages $38_{1-6}$ of the register 34 are reset, D3–D0 set the flip-flops $38_{2-5}$ in the same state D3–D0 have, whereas flip-flop $38_1$ is forced in the state reversed to that of D5. Each clock pulse shifts this reversed-relative-to-D5 state one step to the right until 1XXXXX transforms into 100000, or 0XXXXX transforms into 011111.

Figure 7:
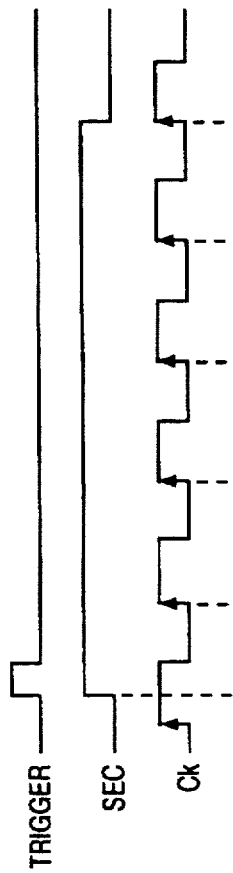
FIG. 7 is a timing sequence chart for the trigger, SEL and CK signals for the circuit diagram of FIG. 6.

The sequence for the trigger, the SEL and the CK signals and their relationships are shown in FIG. 7. Before the trigger signal starts, SEL=0, D5–D0 are sent to Q5–Q0 after being latched by the CK (clock) signal. If the trigger signal occurs such that SEL=1, the shift register 34 starts working. When D5–D0 is above the mid-point, D4–D0 shift one bit to the right every time it goes through the clock. The reverse phase of D5 is compensated from the left or 0 until Q5–Q0 become 100000 or the mid-point of the waveform in order to make SEL=0 and to start the playback of the new speech sound. If D5–D0 is below the mid-point when the trigger signal starts, D4–D0 shift one-bit to the right every time it goes through the clock, the reverse phase of D5 is compensated from the left or from 1 until Q5–Q0 become 011111 or the middle of the waveform such that SEL=0.

Figure 8:
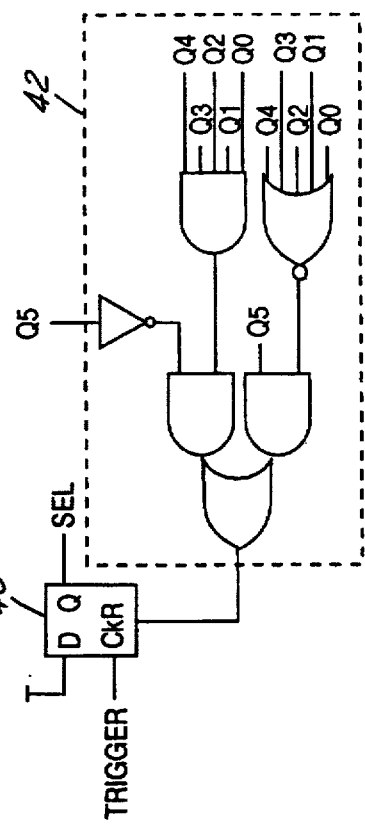
FIG. 8 is a logic diagram for the circuit of the control unit shown in FIG. 5.

The control unit 32 in FIG. 5 is shown in detail in FIG. 8 in a logic diagram. When the trigger signal starts to make SEL=1 and Q5=1, the mid-point is 100000. When Q5=0, the mid-point is 011111 which makes SEL=0 when the mid-point is reached. For instance, when the trigger signal occurs, D5–D0 are 101111, the shift register 34 changes the sequence of the 6-bit into 100111, 100011, 100001, 100000. If the period of the CK signal is 2 ms, after a total of four period or 8 ms, the waveform reaches the mid-point. This is shown in FIG. 12 where an exponential ascending or descending curve is shown to reach the mid-point from C' to D' and also from E' to F'.

In FIG. 8, it is shown that the control unit 32 produces the SEL signal, the trigger signal initiates a flip-flop 40 outputting the continuous SEL signal, whereas a logic circuit 42 of gates AND, OR, NOR, and inverter, shown in FIG. 8, transform Q5~Q0 combinations 100000 or 011111 into logic "1" resetting the flip-flop 40 and cancelling the SEL signal.

Figure 13:
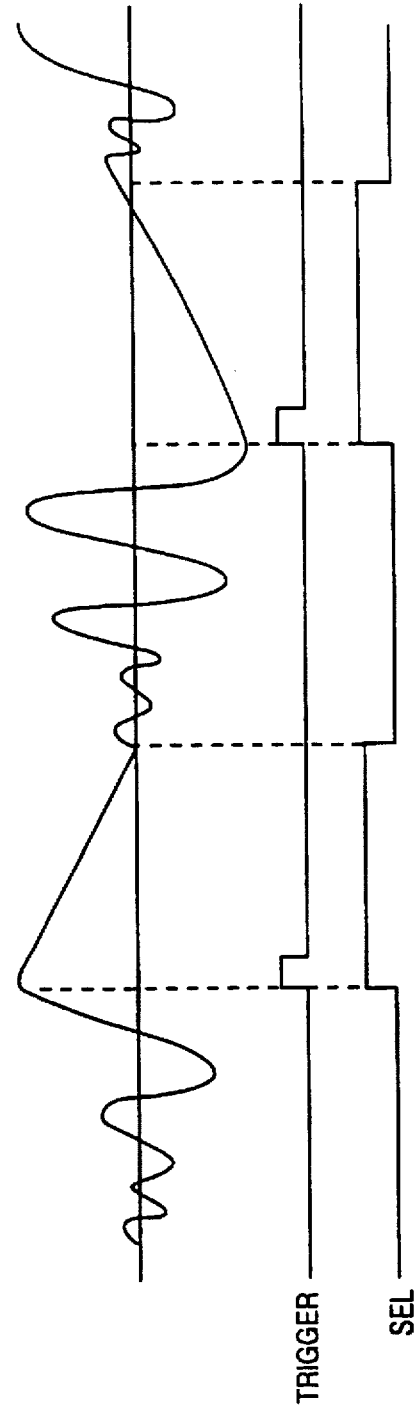
FIG. 13 is a graph for the waveform and the timing sequence for the present invention in an alternate embodiment.

When a straight line waveform is used to reach the mid-point (as shown in FIG. 13), the digital signal processing unit shown in FIG. 5 can be carried out as it is illustrated in FIG. 9. The unit comprises five serial adder circuits ADDA $44_{1-5}$, a D-type flip-flop 46, and logic gates 48. The ADDA circuit shown in detail in FIG. 10 consists of a full adder 50, a multiplexer 52, a D-type flip-flop 54, and logic gates 56. A logic diagram of the adder 46 is represented in FIG. 11. When D5 passes through a D-type flip-flop 46, it is changed to Q5. The circuit utilizes an incremental addition or incremental substraction method to make the waveform to approach the mid-point.

When SEL=0, it represents there are no new trigger signal occurring, D1 passes through multiplexer 52 to input A of adder 50. At the same time, SEL=0 passes as 0 to input B of adder 50. The carry-in signal CI for the first rank adder circuit ADDA $46_1$ is 0, such that CIs for the other ADDAs are sent to 0 to make D[4:0] and 0 added together which does not change the result and then directly sent to Q[4:0] through the clock latch of flip-flop 46 and flip-flop 54 to maintain the original value for output.

When SEL=1, there might be two occurrences: D5=1 and D5=0. If D5=1 it means that the curve (FIG. 13) is above the mid-point, and therefore it needs to be incrementally decreased. The first rank CI is sent into 0, whereas all the other CIs are sent into 1 to make D[4:0] and 11111 to be added together. After adding together, it equals to minus 1 and takes 1 away from 11111 and sent out through the CK latch. It is also sent back through the multiplexer to input A, to perform the next stage of addition until D[5:0] decrease to 100000. If D5=0, it indicates that the curve is below the mid-point, therefore it needs to be incrementally increased by 1. Input B of the ADDA is in 0 as long as the first rank ADDA CI signal is in 1. It is the same as the increase by 1. In a similar way, D[5:0] gradually increases to 011111. The circuit shown in FIG. 9 makes the waveform to approach the mid-point such as that shown in FIG. 13.

While the present invention has been described in an illustrative manner, it should be understood that the terminology used is intended to be in a nature of words of description rather than of limitation.

Furthermore, while the present invention has been described in terms of a preferred embodiment and an alternate embodiment, it is to be appreciated that those skilled in the art will readily apply these teachings to other possible variations of the invention.

The embodiments of the invention in which an exclusive property or privilege is claimed are defined as follows:

I claim:

1. A method for eliminating discontinuity noise in repeated sound start during the playback of a digital synthesis or recording playback system comprising the step of:

examining a bit position of a sound in a playback of a waveform on a digital axis at a point of said sound being interrupted by triggering a playback of another sound;

determining a bit distance between said bit position and a mid-point position on the digital axis;

generating an incrementally decreasing or increasing digital sequence based on said determined bit distance, and adding said incrementally decreasing or increasing digital sequence to said bit position such that said playback of said sound slowly descends or ascends to said mid-point position on the digital axis thus avoiding a discontinuity of said waveform occurring at said point of interruption thereby eliminating noise resulted from said discontinuity.

2. The method according to claim 1, wherein said incrementally decreasing or increasing digital sequence is generated by a signal controlled by triggering a playback of another sound.

3. The method according to claim 1, wherein said incrementally decreasing digital sequence is composed of a most significant bit (MSB) of "one" and a number of "zeros" shifting towards said mid-point position, said mid-point position being defined as noiseless discontinuity position.

4. The method according to claim 1, wherein said incrementally increasing code is composed of a most significant bit (MSB) of "zero" and a number of "ones" shifting towards said mid-point position, said mid-point position being defined as noiseless discontinuity position.

5. An apparatus for eliminating noise in repeated sound starts during playback of a digital waveform sound recording, comprising a signal processor for generating an incrementally decreasing or increasing digital sequence to be added to a sound bit position on a digital axis such that a discontinuity in the digital waveform and the related noise generated can be avoided.

6. An apparatus for playback of a digital sound recording eliminating noise in repeated sound starts during the playback of the digital sound recording, the apparatus comprising:

an address generator for producing speaking sound code storage addresses;

a memory unit for storing said addresses and reading the same therefrom, said memory unit being connected to said address generator;

a signal processor for generating an incrementally decreasing or increasing digital sequence to be added to a sound bit position on a digital axis such that a discontinuity in the playback of the digital sound recording and the related noise generated by said discontinuity can be avoided, said processor being fed by a signal controlled by triggering a start of a playback of another digital sound recording; and a control unit for controlling said processor, said control unit being input from the output of said signal processor and having its output connected to a control input of said signal processor.

7. The method according to claim 1 wherein said bit position at said point of said sound being interrupted is a non-midpoint.

8. The apparatus according to claim 6 wherein said bit position at said point of said sound being interrupted is a non-midpoint.

* * * * *